(12) United States Patent
Kudo

(10) Patent No.: US 7,932,712 B2
(45) Date of Patent: Apr. 26, 2011

(54) CURRENT-MIRROR CIRCUIT

(75) Inventor: Masahiro Kudo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/691,836

(22) Filed: Jan. 22, 2010

(65) Prior Publication Data

US 2010/0117619 A1     May 13, 2010

Related U.S. Application Data

(63) Continuation of application No. PCT/JP2007/068236, filed on Sep. 20, 2007.

(51) Int. Cl.
*G05F 3/26* (2006.01)
(52) U.S. Cl. .................... 323/315; 327/543
(58) Field of Classification Search .............. 323/315, 323/317, 312; 327/543, 490; 330/288
See application file for complete search history.

(56) References Cited

U.S. PATENT DOCUMENTS

| | | | | |
|---|---|---|---|---|
| 4,550,284 A | * | 10/1985 | Sooch | 323/315 |
| 5,359,296 A | | 10/1994 | Brooks et al. | |
| 5,952,884 A | * | 9/1999 | Ide | 330/288 |
| 5,966,005 A | * | 10/1999 | Fujimori | 323/315 |
| 6,211,659 B1 | * | 4/2001 | Singh | 323/315 |
| 6,680,605 B2 | * | 1/2004 | Chen et al. | 323/315 |

\* cited by examiner

*Primary Examiner* — Harry Behm
(74) *Attorney, Agent, or Firm* — Katten Muchin Rosenman LLP

(57) ABSTRACT

In a cascode current-mirror circuit which reproduces a reference current generated by a current source and outputs the reproduced reference current: the control electrodes of first and second transistors are connected; a third transistor is cascode-connected to the first transistor through a current electrode; a fourth transistor is cascode-connected to the second transistor; the control electrodes of the third and fourth transistors are connected; the control electrode of a fifth transistor is connected to the control electrode of the first transistor and another current electrode of the third transistor, and is to be connected to the current source; and a bias-voltage generation circuit generates bias voltages for the third and fourth transistors on the basis of voltages of the control electrodes of the first and the fifth transistors.

6 Claims, 8 Drawing Sheets

|  | SW11,SW14 | SW12,SW13 |
|---|---|---|
| Normal Operation | On | Off |
| Power Down | Off | On |

FIG. 6

CURRENT-MIRROR CIRCUIT

This application is a continuing application, filed under 35 U.S.C. Section 111(a), of International Application PCT/JP2007/068236, filed Sep. 20, 2007.

FIELD

The embodiments discussed herein are related to a current-mirror circuit.

BACKGROUND

The current-mirror circuit can reproduce current with an arbitrary amplification ratio, and constitute a basic analog circuit block. Therefore, the current-mirror circuit is widely used in various circuit devices. In some cases, high output impedance is required in the current-mirror circuit for correctly reproducing current.

The cascode current-mirror circuit has features such as the very high output impedance and the relatively high speed in operation. However, there is a drawback that the structure of the cascode current-mirror circuit (in which transistors are cascode-connected) reduces the voltage margin of the circuit. Therefore, cascode current-mirror circuits which overcome the above drawback and are adapted for low-voltage operation are being widely used.

FIG. 7 is a circuit diagram illustrating a conventional cascode current-mirror circuit. The cascode current-mirror circuit of FIG. 7 comprises current sources I101 and I102 and NMOS (Negative-channel Metal-oxide Semiconductor) transistors M101, M102, M111, M121, and M122.

The transistors M101 and M121 constitute a current-mirror circuit, in which the gates of the transistors M101 and M121 are connected to each other. The transistors M102 and M122 constitute a current-mirror circuit, in which the gates of the transistors M102 and M122 are connected to each other. The transistor M122 reduces the variations in the drain-source voltage of the transistor M121, and therefore increases the output impedance.

The two current sources I101 and I102 generate such bias voltages that the transistors M101, M121, M102, and M122 operate in a saturated region. In other words, the cascode current-mirror circuit of FIG. 7 needs the two current sources I101 and I102 for normal operation of the cascode current-mirror circuit.

The current outputted from the current source I101 flows through the transistors M101 and M102. The transistors M121 and M122 operate in bias states which are respectively identical to the transistors M101 and M102, and output the current Iout. The amount of the current Iout can be adjusted at a desired ratio with respect to the amount of the current outputted from the current source I101, by configuring the transistors M101, M102, M121, and M122 so that the dimension ratio between the transistors M101 and M102 and the transistors M121 and M122 is a desired value.

FIG. 8 is a block diagram of a circuit system in which the cascode current-mirror circuit of FIG. 7 is used. The circuit system of FIG. 8 includes the blocks of a bias circuit 101 and operational circuits 111 to 114. The bias circuit 101 supplies a reference current to the operational circuits 111 to 114. The operational circuits 111 to 114 generate reproduced currents on the basis of the reference current, and operate with the reproduced currents. Each of the operational circuits 111 to 114 contains a cascode current-mirror circuit which has an identical construction to the cascode current-mirror circuit of FIG. 7 except that the current sources I101 and I102 are removed from the cascode current-mirror circuit. The bias circuit 101 contains the current sources I101 and I102.

Since the cascode current-mirror circuit of FIG. 7 necessitates the two reference currents (generated by the current sources I101 and I102), two wiring paths are required to be arranged from the bias circuit 101 to each of the operational circuits 111 to 114, so that the area for arrangement of wirings between the bias circuit 101 and the operational circuits 111 to 114 increases.

Incidentally, in a conventionally proposed cascode current-mirror circuit, two bias voltages are generated from a single reference current by using a resistor element. (For example, see Japanese Laid-open Patent Publication No. 8-88521, which is hereinafter referred to as JPP8-88521.)

As explained above, when the conventional cascode current-mirror circuit which needs two current sources is used, the area for arrangement of wirings increases.

SUMMARY

According to an aspect of the embodiments, a current-mirror circuit which reproduces a reference current generated by a current source and outputs the reproduced reference current, includes: a first transistor having a first control electrode; a second transistor having a second control electrode connected to the first control electrode; a third transistor having a third control electrode and current electrodes, and being cascode-connected to the first transistor through one of the current electrodes; a fourth transistor having a fourth control electrode connected to the third control electrode, and being cascode-connected to the second transistor; a fifth transistor being arranged parallel to the third transistor, and having a fifth control electrode which is connected to the first control electrode and another of the current electrodes of the third transistor, and is to be connected to the current source; and a bias-voltage generation circuit generating bias voltages for the third transistor and the fourth transistor on the basis of voltages of the first control electrode and the fifth control electrode.

The objects and advantages of the invention will be realized and attained by means of the elements and combinations particularly pointed out in the claims.

It is to be understood that both the forgoing general description and the following detailed description are exemplary and explanatory and are not restrictive of the invention, as claimed.

BRIEF DESCRIPTION OF THE DRAWING(S)

FIG. 6 is a diagram indicating the states of the transistors during normal operation and power down;

DESCRIPTION OF EMBODIMENT(S)

Embodiments of the present invention will be described below with reference to the accompanying drawings, wherein like reference numbers refer to like elements throughout.

1. First Embodiment

A current-mirror circuit according to the first embodiment is explained below, with reference to FIG. 1, which illustrates a current-mirror circuit according to the first embodiment. The current-mirror circuit of FIG. 1 comprises transistors M11 to M15, a current source I11, and a bias-voltage generation circuit 11.

The current source I11 outputs a reference current. The source of the transistor M1 is connected to a power supply Vss, which outputs, for example, the ground-level voltage. The drain of the transistor M11 is connected to the sources of the transistors M12 and M13. The gate of the transistor M11 is connected to gate of the transistor M12 and the drains of the transistors M12 and M13. The drains of the transistors M12 and M13 are connected to each other, and the sources of the transistors M12 and M13 are also connected to each other. The drains of the transistors M12 and M13 are further connected to a terminal of the current source I11. Another terminal of the current source I11 is connected to a power supply Vdd, which is, for example, a source of a positive voltage. The gate of the transistor M14 is connected to the gate of the transistor M11, so that the transistors M11 and M14 constitute a current-mirror circuit. The source of the transistor M14 is connected to the power supply Vss. The drain of the transistor M14 is connected to the source of the transistor M15. The gate of the transistor M15 is connected to the gate of the transistor M13, so that the transistors M15 and M13 constitute a current-mirror circuit. The transistor M15 outputs a current Iout from the drain, where the amount of the current Iout is at a desired ratio with respect to the amount of the current outputted from the current source I11. In addition, the current-mirror circuit constituted by the transistors M11 and M14 is cascode-connected to the current-mirror circuit constituted by the transistors M13 and M15.

The bias-voltage generation circuit 11 is connected between the power supply Vss and the gates of the transistors M13 and M15. The bias-voltage generation circuit 11 generates a bias voltage for the transistors M13 and M15 on the basis of the gate voltage of the transistors M11 and M12 (i.e., the bias control voltage). In particular, the bias-voltage generation circuit 11 is configured so that the bias voltage generated by the bias-voltage generation circuit 11 is greater than the bias control voltage in the final stage (i.e., when the operation of the current-mirror circuit of FIG. 1 is stabilized after the reference current is outputted from the current source I11).

Figure 1:
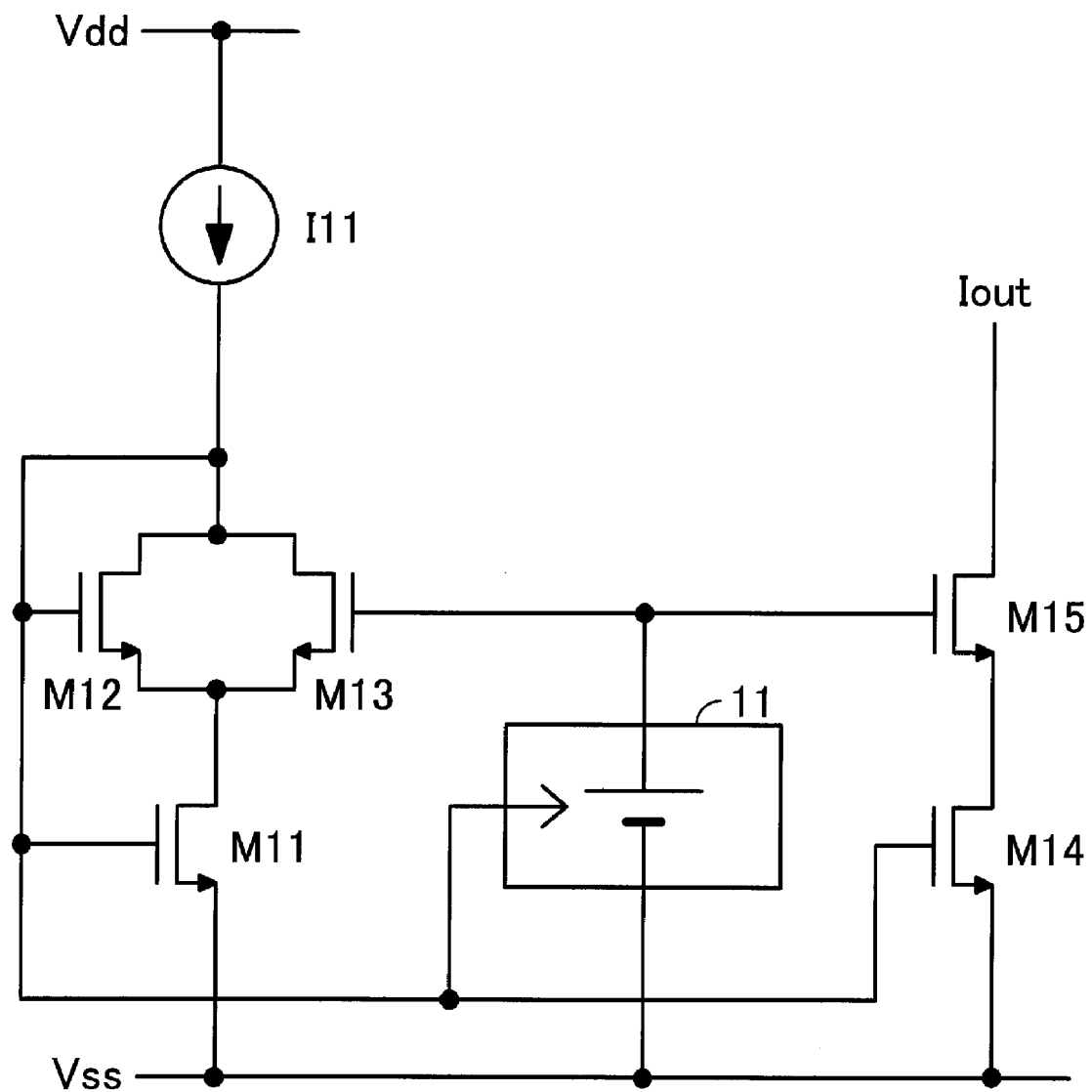
FIG. 1 is a circuit diagram of a current-mirror circuit according to a first embodiment.

The operations of the current-mirror circuit of FIG. 1 are explained below.

When the power supplies Vdd and Vss are powered on, current flows through the current source I11, so that the gate voltage of the transistors M11 and M12 (which are diode connected) rises. When the gate voltage of the transistors M11 and M12 reaches a threshold voltage, the current outputted from the current source I11 flows through the drains and the sources of the transistors M11 and M12. The gate voltage of the transistors M11 and M12 is inputted into the bias-voltage generation circuit 11. The bias-voltage generation circuit 11 generates the bias voltages for the transistors M13 and M15 on the basis of the gate voltage of the transistors M11 and M12 (bias control voltage). The transistors M12 and M13 are connected in parallel in such a manner that the sum of the current flowing through the transistors M12 and M13 flows through the transistor M11. Therefore, for example, in the case where the transistors M12 and M13 have identical characteristics (e.g., identical gate lengths and gate widths), when the bias voltage supplied to the transistor M13 rises to the gate voltage of the transistor M12, half of the reference current outputted from the current source I11 flows through each of the transistors M12 and M13. The bias-voltage generation circuit 11 applies to the gate of the transistor M13 the bias voltage, which is greater than the gate voltage of the transistor M12 in the final stage. The bias voltage is determined so that the transistor M11 operates in a saturated region and the transistor M12 is substantially turned off while the bias voltage is applied to the transistor M13. For example, the bias-voltage generation circuit 11 is configured to generate a voltage higher than the gate voltage of the transistor M12 by 0.2V or more (e.g., 0.25V) in the case where the gate-source voltage of each of the transistors M11 and M12 is 0.2V higher than the threshold voltage of the transistor while the transistors M11 and M12 are biased with the reference current. Therefore, while the bias voltage as above is applied to the transistor M13, almost all of the current outputted from the current source I11 flows through the transistor M13, i.e., the current outputted from the current source I11 substantially flows through the transistors M13 and M11. Since the bias voltage is also applied to the transistor M15 by the bias-voltage generation circuit 11, the transistor M15 is also turned on together with the transistor M13, so that the current flowing through the transistors M13 and M11 are reproduced in the path through the transistors M14 and M15. Therefore, the current Iout is outputted from the transistor M15. At this time, the bias control voltage turns on the transistor M14.

As explained above, in the current-mirror circuit of FIG. 1, the current outputted from the current source I11 flows through the transistors M11 and M12 on startup. Then, the bias-voltage generation circuit 11 turns on the transistors M13 and M15 on the basis of the bias control voltage, so that the current outputted from the current source I11 flows through the transistors M11 and M13. When the operation of the circuit is stabilized after the reference current is outputted from the current source I11, the current flowing through the transistors M13 and M11 is reproduced in the path through the transistors M14 and M15.

Next, details of the bias-voltage generation circuit 11 are explained below.

Figure 2:
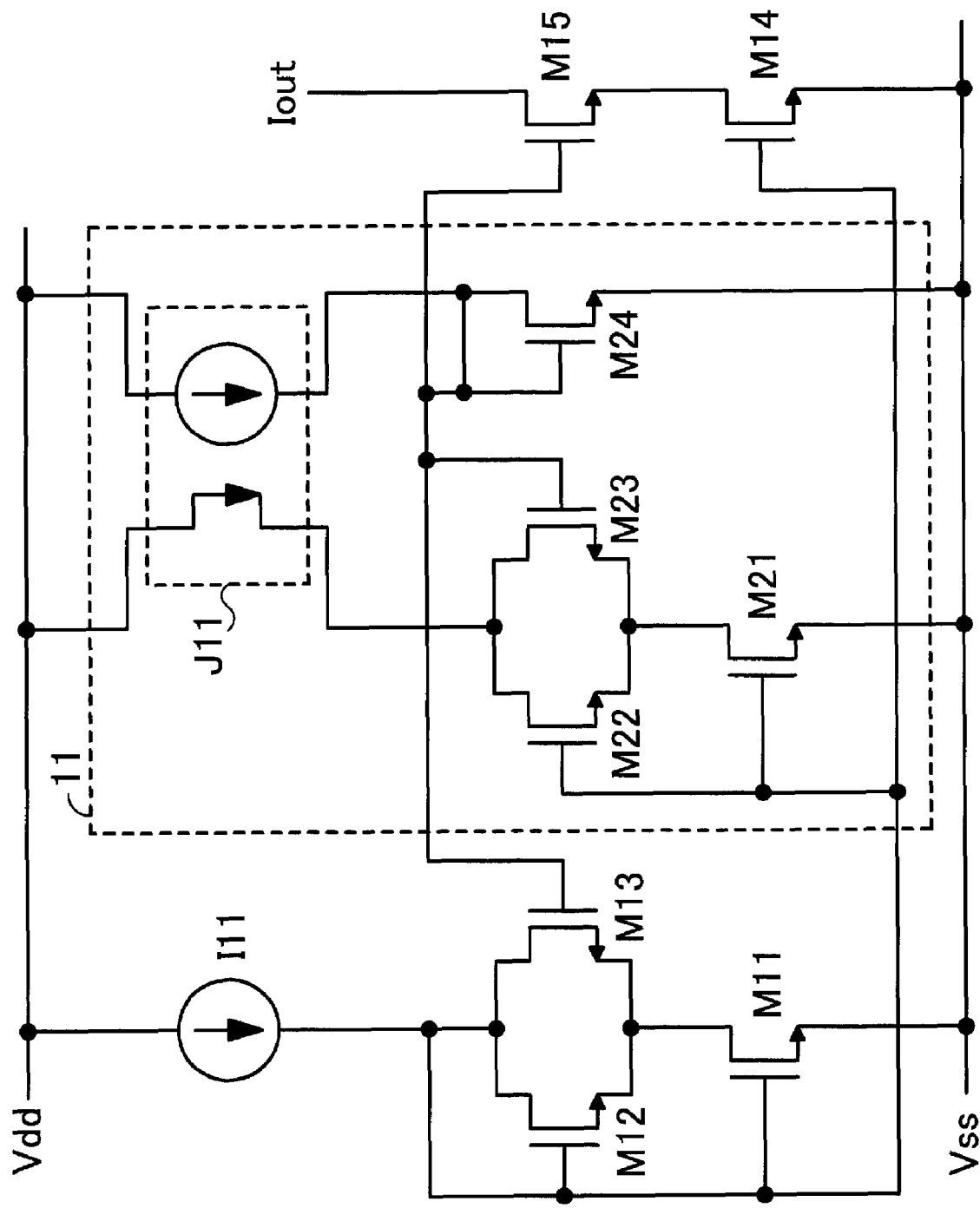
FIG. 2 is a circuit diagram of a current-mirror circuit illustrating details of a bias-voltage generation circuit.

FIG. 2 illustrates details of the bias-voltage generation circuit 11. In FIG. 2, the same elements as FIG. 1 bear the same reference numbers as FIG. 1, respectively, and the explanations on the same elements as FIG. 1 are not repeated below.

The bias-voltage generation circuit 11 of FIG. 2 comprises NMOS transistors M21 to M24 and a current-mirror circuit J11. The transistors M21 to M23 are connected to each other so as to form the same circuit structure as the circuit structure formed with the transistors M11 to M13. The gates of the transistors M21 and M22 are connected to the gates of the transistors M11 and M12. The drains of the transistors M22 and M23 are connected to the current-mirror circuit J11. The gate of the transistor M23 is connected to the gates of the transistors M13, M15, and M24. The gate of the transistor M24 is connected to the gates of the transistors M13, M15, and M23. The drain and the gate of the transistor M24 are connected so as to realize a diode connection. In addition, the drain of the transistor M24 is connected to the current-mirror circuit J11. The source of the transistor M24 is connected to the power supply Vss. The current-mirror circuit J11 reproduces the current flowing in the path between the power supply Vdd and the drains of the transistors M22 and M23, in the path between the power supply Vdd and the drain of the transistor M24.

Figure 3:
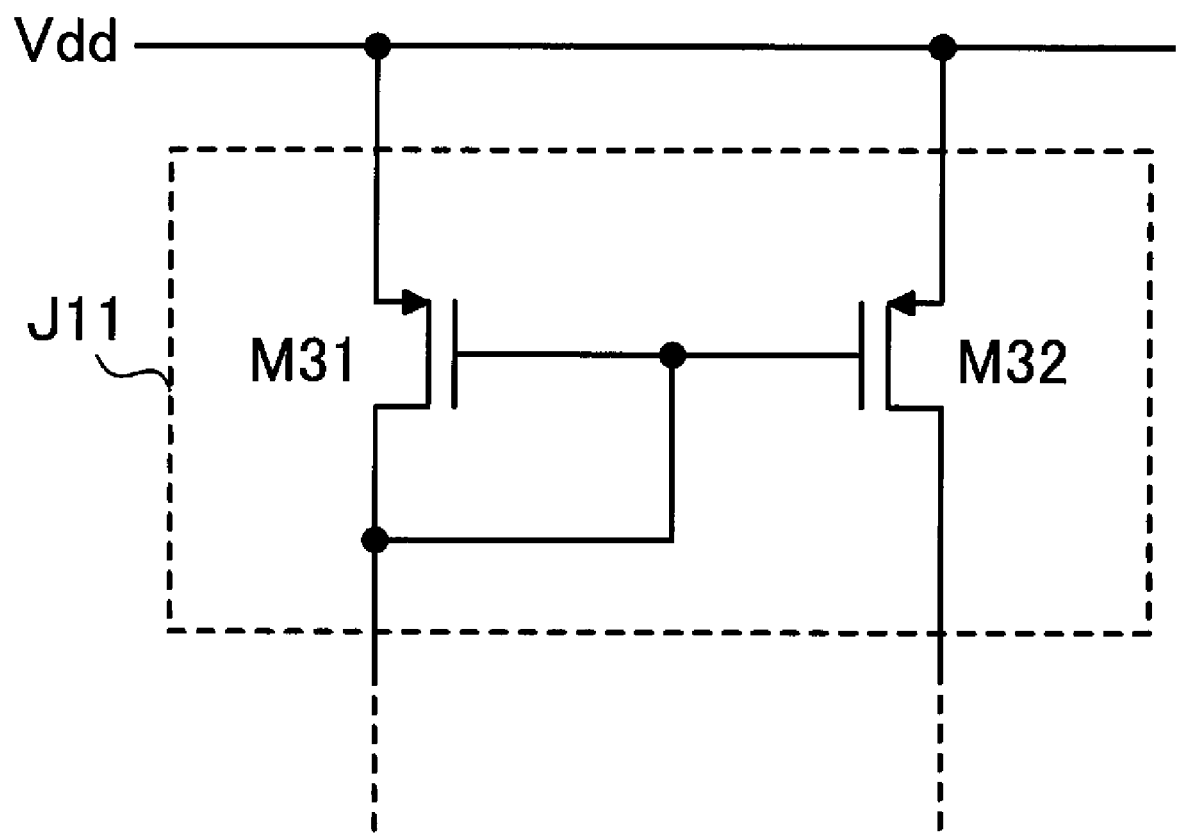
FIG. 3 is a circuit diagram illustrating an example of a current-mirror circuit J11 as a part of the current-mirror circuit of FIG. 2.

An example of the current-mirror circuit J11 is illustrated in FIG. 3. The current-mirror circuit J11 of FIG. 3 comprises PMOS (Positive-channel Metal-oxide Semiconductor) transistors M31 and M32. The sources of the transistors M31 and M32 are connected to the power supply Vdd. The gates of the transistors M31 and M32 are connected to each other, and are further connected to the drain of the transistor M31. The drain of the transistor M31 is connected to the drains of the transistors M22 and M23 (indicated in FIG. 2). The drain of the transistor M32 is connected to the drain of the transistor M24.

The operations of the current-mirror circuit of FIG. 2 are explained below.

When the power supplies Vdd and Vss are powered on, current flows through the current source I11, so that the gate voltage of the transistors M11 and M12 (which are diode connected) rises. When the gate voltage of the transistors M11 and M12 reaches the threshold voltage, the current outputted from the current source I11 flows through the transistors M11 and M12. Since the transistors M21 to M23 are connected to each other so as to form the same circuit structure as the circuit structure formed with the transistors M11 to M13, and the gates of the transistors M21 and M22 are connected to the gates of the transistors M11 and M12, the transistors M11, M12, M21, and M22 constitute a current-mirror circuit. Therefore, the current flowing through the transistors M12 and M11 are reproduced in the path through the transistors M22 and M21. Further, the current-mirror circuit J11 reproduces the current flowing through the transistors M22 and M21, in the path through the transistor M24. Since the transistor M24 is diode connected, the current reproduced by the current-mirror circuit J11 turns on the transistor M24, and the current-mirror circuit J11 applies the bias voltage to the transistors M13, M15, and M23. When the bias voltage for the transistors M13, M15, and M23 reaches the threshold voltages of the transistors M13, M15, and M23, the transistors M13, M15, and M23 are turned on, so that the current outputted from the current source I11 flows through the transistors M13 and M11. Since the circuit structure formed with the transistors M21 to M23 and the circuit structure formed with the transistors M11 to M13 are identical, and the gates of the transistors M13 and M23 are connected to each other, the current flowing through the transistors M13 and M11 are reproduced in the path through the transistors M23 and M21. In addition, the current-mirror circuit J11 reproduces the current flowing in the path through the transistors M21 and M23, in the path between the power supply Vdd and the drain of the transistor M24.

The current-mirror circuit of FIG. 2 is configured so that the bias voltage applied to the transistors M13, M23, and M15 exceeds the bias control voltage when current flows through the transistors M21 and M23. For example, adjustment of the current reproduction ratio in the current-mirror circuit J11 and the characteristics of the transistor M24 can make the bias voltage exceed the bias control voltage.

As explained above, when the current-mirror circuit of FIG. 2 is started up, current flows through the transistors M11 and M12, and through the transistors M21 and M22 in the bias-voltage generation circuit 11. The current-mirror circuit J11 reproduces in the transistor M24 the current flowing through the transistors M21 and M22, and supplies the bias voltage to the gates of the transistors M3, M23, and M15. Thereafter, the current outputted from the current source I11 flows through the transistors M13 and M11, and is mirrored to the path through the transistors M23 and M21. Further, the current flowing through the transistors M23 and M21 is mirrored by the current-mirror circuit J11 to the path through the transistor M24. Thus, the current flowing through the transistors M13 and M11 is reproduced in the path through the transistors M15 and M14.

In other words, in the current-mirror circuit of FIG. 2, the current outputted from the current source I11 is reproduced by the current-mirror circuit J11, so that the current-mirror circuit of FIG. 2 operates substantially with the current outputted from the current source I11 and the current outputted from the current-mirror circuit J11. Thus, the current-mirror circuit of FIG. 2 realizes a high-precision current-mirror circuit operating with low voltage (e.g., with the power supply voltage Vdd of 1.2V).

Further, the gate voltage of the transistors M11 and M12 is applied to the transistor M14, so that the transistor M14 also operates in a saturated region.

Figure 4:
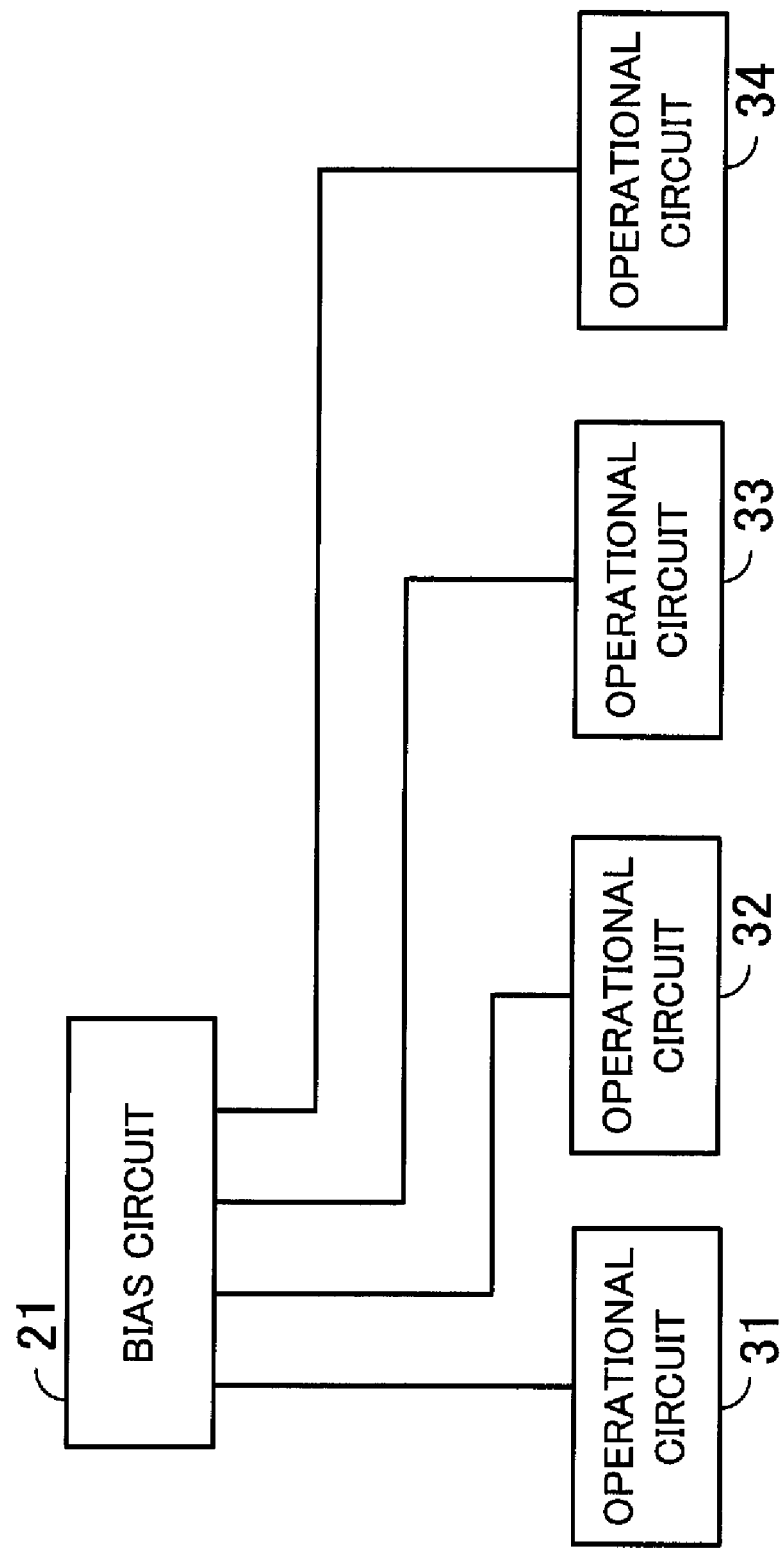
FIG. 4 is a block diagram of an example of a circuit system in which the current-mirror circuit of FIG. 1 is used.
Figure 7:
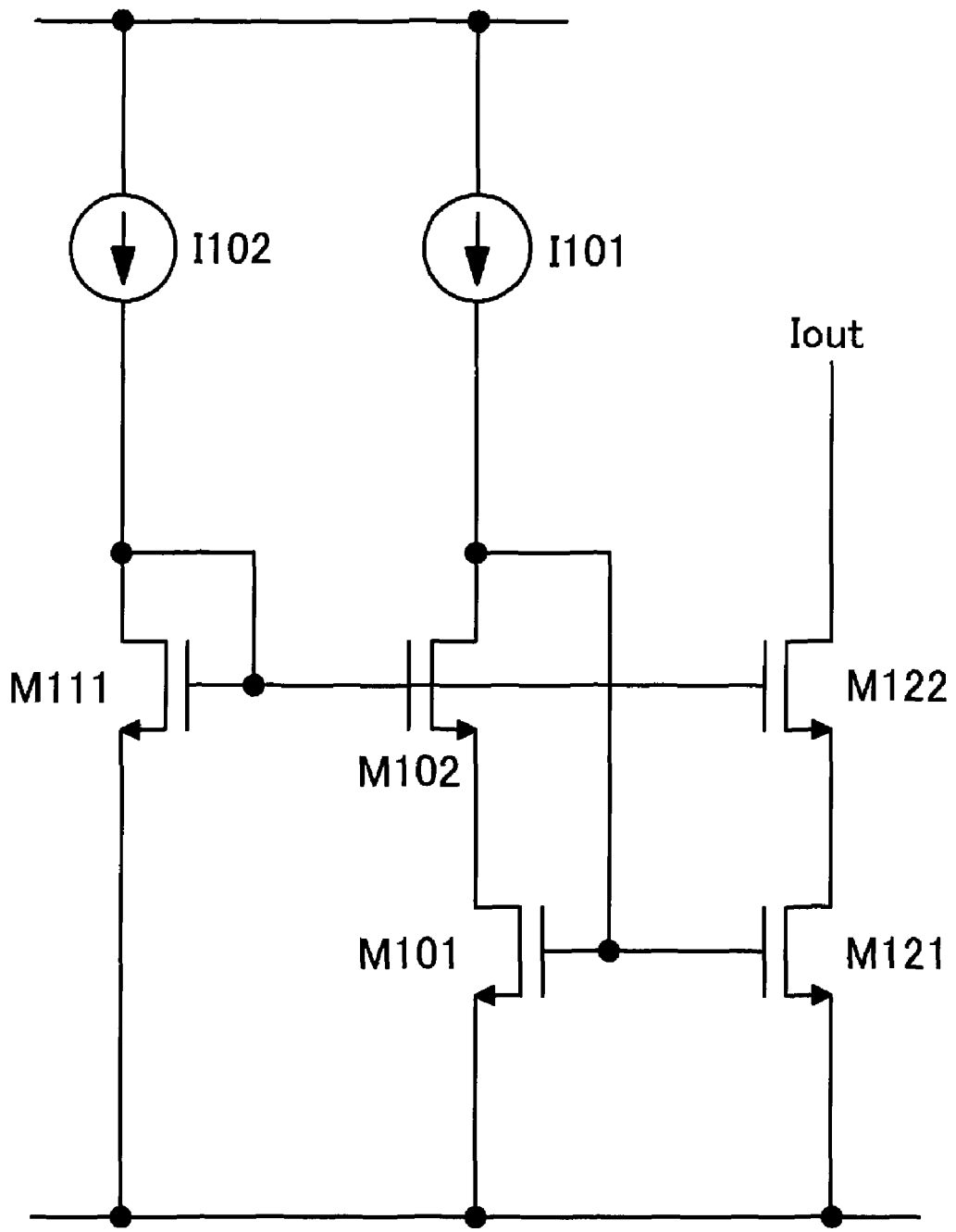
FIG. 7 is a circuit diagram illustrating a conventional cascode current-mirror circuit.
Figure 8:
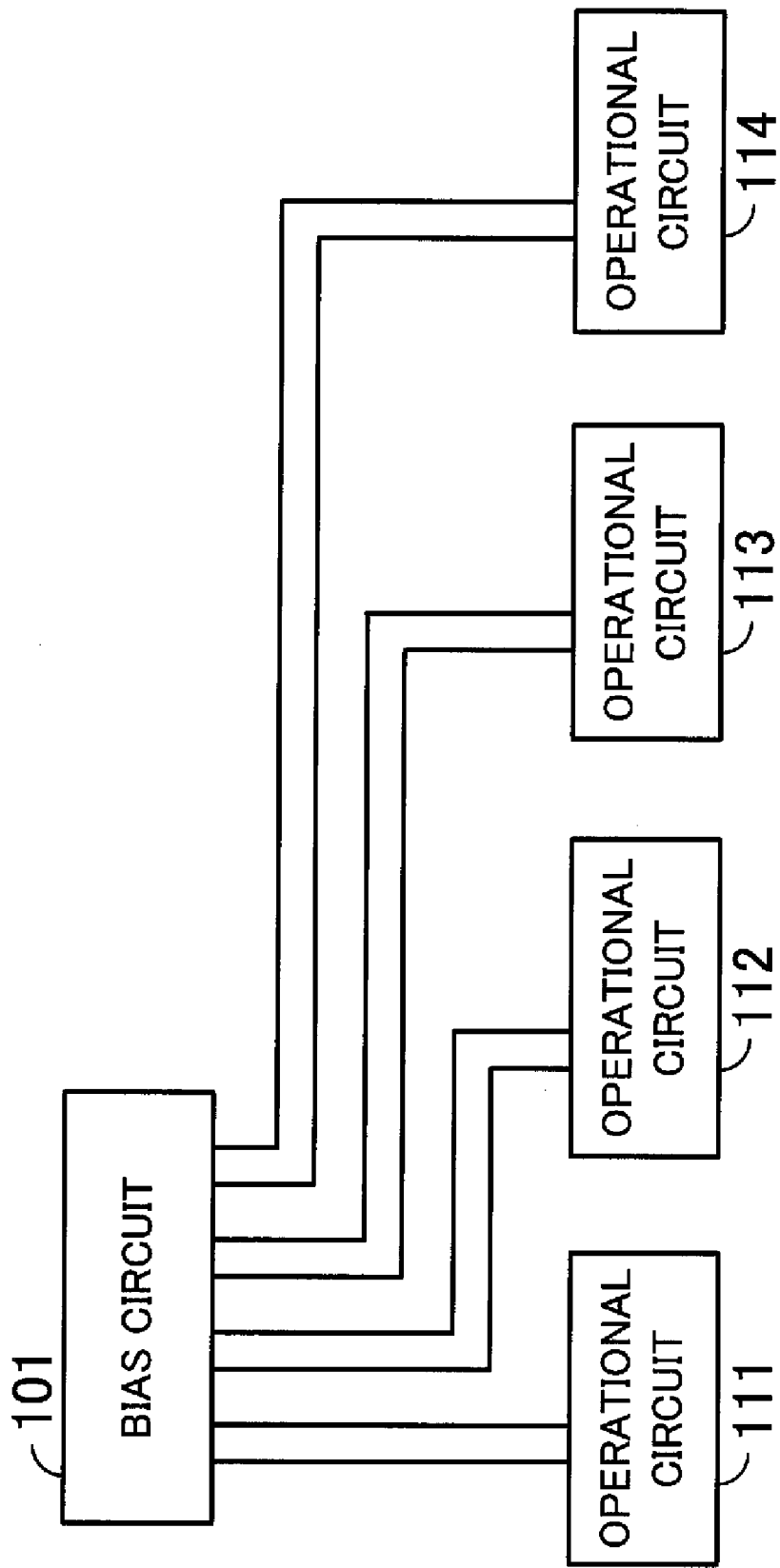
FIG. 8 is a block diagram of an example of a circuit system in which the cascode current-mirror circuit of FIG. 7 is used.

FIG. 4 is a block diagram of an example of a circuit system in which the current-mirror circuit of FIG. 1 is used. The circuit system of FIG. 4 includes the blocks of a bias circuit 21 and operational circuits 31 to 34. The bias circuit 21 supplies a reference current to the operational circuits 31 to 34. The operational circuits 31 to 34 generate reproduced currents on the basis of the reference current, and operate with the reproduced currents. Each of the operational circuits 31 to 34 contains a current-mirror circuit which has an identical construction to the current-mirror circuit of FIGS. 1 and 2 except that the current source I11 is removed. The bias circuit 21 contains the current source I11. Since the current-mirror circuit illustrated in FIGS. 1 and 2 operates by receiving only the reference current outputted from the current source I11, it is sufficient to arrange only one wiring path from the bias circuit 21 to each of the operational circuits 31 to 34. Therefore, the area for arrangement of the wirings in the system illustrated in FIG. 4 using the current-mirror circuit illustrated in FIGS. 1 and 2 is smaller than the area for arrangement of the wirings in the system illustrated in FIG. 8 using the conventional cascode current-mirror circuit illustrated in FIG. 7. Thus, the matching problem and the like can be suppressed by use of the current-mirror circuit illustrated in FIGS. 1 and 2. As explained above, since the current-mirror circuit illustrated in FIGS. 1, 2, and 3 can operate by using the single current source and reproducing the reference current, increase in the area for arrangement of the wirings can be suppressed.

Further, the current-mirror circuit illustrated in FIGS. 1, 2, and 3 can precisely reproduce the reference current with small variations. For example, since the circuit disclosed in JPP8-88521 is constituted by two different types of circuit elements, the resistor and the transistors, the operation of the transistors in the circuit disclosed in JPP8-88521 can go out of the saturated region, i.e., can go out of the normally operating condition. Therefore, the reproduced current can greatly vary in the circuit disclosed in JPP8-88521. On the other hand, the current-mirror circuit illustrated in FIGS. 1, 2, and 3 is constituted by only one type of circuit elements (i.e., the transistors). Therefore, even in the case where process variations cause characteristic variations, it is possible to normally operate the transistors, and therefore precisely reproduce the reference current with small variations.

Alternatively, the current-mirror circuit illustrated in FIGS. 1 and 2 can be constituted by PMOS transistors instead of the NMOS transistors. In this case, the current-mirror circuit of FIG. 3 is constituted by NMOS transistors instead of the PMOS transistors.

2. Second Embodiment

Next, the second embodiment is explained in detail below with reference to FIGS. 5 and 6. In order to reduce consumption power, some electronic circuits have a power-down mode. The current-mirror circuit according to the second embodiment is configured not to output the current Iout to an electronic circuit when the electronic circuit is in a power-down mode.

Figure 5:
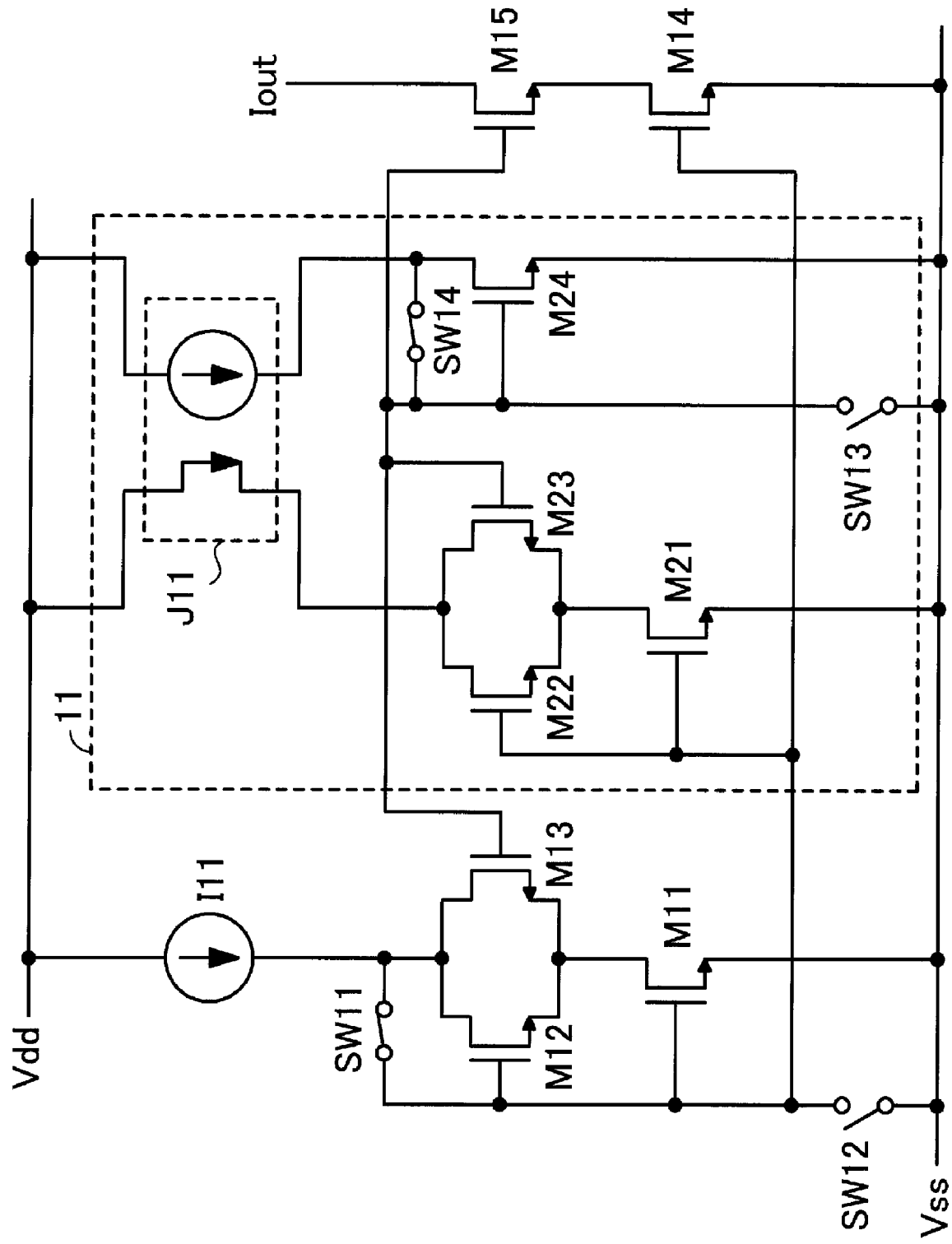
FIG. 5 is a circuit diagram of a current-mirror circuit according to a second embodiment.

FIG. 5 illustrates a current-mirror circuit according to the second embodiment. In FIG. 5, the same elements as FIG. 2 bear the same reference numbers as FIG. 2, respectively, and the explanations on the same elements as FIG. 2 are not repeated below.

As illustrated in FIG. 5, a switch SW11 is connected between the gate and the drain of the transistor M12, and a switch SW12 is connected between the gate of the transistor M11 and the power supply Vss. In addition, a switch SW13 is connected between the gate of the transistor M24 and the power supply Vss, and a switch SW14 is connected between the gate and the drain of the transistor M24.

Each of the switches SW11 to SW14 is connected to a controlling device, for example, a CPU (central processing unit), and is turned on or off when the electronic circuit is powered down. The switches SW11 to SW14 are constituted by, for example, transistors, and control signals for turning on or off the switches SW11 to SW14 are applied to the gates of the transistors, respectively.

FIG. 6 is a diagram indicating the states of the transistors during normal operation and power down. As indicated in FIG. 6, during normal operation (during which the current Iout is to be supplied to the electronic circuit), the switches SW11 and SW14 are turned on, and the switches SW12 and SW13 are turned off, so that a circuit equivalent to the current-mirror circuit of FIG. 2 is realized in the current-mirror circuit of FIG. 5, and the current-mirror circuit of FIG. 5 outputs the current Iout.

When the electronic circuit is powered down, the switches SW11 and SW14 are turned off, and the switches SW12 and SW13 are turned on, as indicated in FIG. 6. Since the switches SW12 and SW13 are turned on, the gates of the transistors M11, M12, M14, M21, M22, M24 are connected to the power supply Vss, so that the transistors M11, M12, M14, M21, M22, M24 are turned off. Therefore, the current-mirror circuit of FIG. 5 does not output the current Iout. In addition, since the switches SW11 and SW14 are turned off, it is possible to prevent the flows of the currents from the current source I11 and the current-mirror circuit J11 to the power supply Vss.

However, the switches SW13 and SW14 are not absolutely necessary. When the switch SW12 is turned on, no current flows through the transistors M11 to M13. Thus, no current is reproduced by the current-mirror circuit J11 and flows through the transistor M24. Nevertheless, in order to protect the transistor M24, it is desirable to arrange the transistors SW13 and SW14.

As explained above, the current-mirror circuit of FIG. 5 can cope with the power down of the electronic circuit and reduce the power consumption by arranging the switches SW11 to SW14.

In the current-mirror circuit according to the embodiments, the bias voltages for the third and fourth transistors are generated on the basis of the voltages of the control electrodes of the first and fifth electrodes. Therefore, the current-mirror circuit according to the present invention can reproduce the reference current from the single current source. Thus, increase in the area for arrangement of wirings needed for supplying the reference current can be suppressed.

3. Additional Matters

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that various changes, substitutions and alterations could be made hereto without departing from the spirit and scope of the invention.

What is claimed is:

1. A current-mirror circuit which reproduces a reference current generated by a current source and outputs the reproduced reference current, comprising:
   a first transistor having a first control electrode;
   a second transistor having a second control electrode connected to said first control electrode;
   a third transistor having a third control electrode and current electrodes, and being cascode-connected to said first transistor through one of the current electrodes;
   a fourth transistor having a fourth control electrode connected to said third control electrode, and being cascode-connected to said second transistor;
   a fifth transistor being arranged parallel to said third transistor, and having a fifth control electrode which is connected to said first control electrode and another of said current electrodes of the third transistor, and is to be connected to said current source; and
   a bias-voltage generation circuit generating bias voltages for said third transistor and said fourth transistor on the basis of voltages of said first control electrode and said fifth control electrode.

2. The current-mirror circuit according to claim 1, wherein said bias-voltage generation circuit includes,
   a current generation circuit which generates a current identical to a current flowing through said first transistor,
   a current-mirror circuit which reproduces the current generated by said current generation circuit, and
   a bias circuit which generates said bias voltages on the basis of the current reproduced by said current-mirror circuit.

3. The current-mirror circuit according to claim 2, wherein said first transistor, said third transistor, and said fifth transistor constitute a circuit which has an identical form to said current generation circuit.

4. The current-mirror circuit according to claim 2, wherein said bias circuit is constituted by a sixth transistor which is diode connected.

5. The current-mirror circuit according to claim 4, further comprising a third switch which is arranged between said reference voltage and a control electrode of said sixth transistor, and a fourth switch which is arranged between said current-mirror circuit and the control electrode of the sixth transistor.

6. The current-mirror circuit according to claim 1, further comprising a first switch which is arranged between said fifth control electrode and said current source, and a second switch which is arranged between said fifth control electrode and a reference voltage.

* * * * *